United States Patent
Laven et al.

(10) Patent No.: US 9,754,787 B2
(45) Date of Patent: Sep. 5, 2017

(54) METHOD FOR TREATING A SEMICONDUCTOR WAFER

(71) Applicant: Infineon Technologies AG, Neubiberg (DE)

(72) Inventors: Johannes Laven, Taufkirchen (DE); Hans-Joachim Schulze, Taufkirchen (DE); Stephan Voss, Munich (DE); Alexander Breymesser, Villach (AT); Alexander Susiti, Villach (AT); Shuhai Liu, Villach (AT); Helmut Oefner, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 164 days.

(21) Appl. No.: 14/313,366

(22) Filed: Jun. 24, 2014

(65) Prior Publication Data

US 2015/0371858 A1    Dec. 24, 2015

(51) Int. Cl.
*H01L 21/425*  (2006.01)
*H01L 21/263*  (2006.01)
(Continued)

(52) U.S. Cl.
CPC ...... *H01L 21/263* (2013.01); *H01L 21/26506* (2013.01); *H01L 21/3242* (2013.01);
(Continued)

(58) Field of Classification Search
CPC ............ H01L 21/263; H01L 21/26506; H01L 21/3242; H01L 2924/00014;
(Continued)

(56) References Cited

U.S. PATENT DOCUMENTS 7,589,348 B2 *  9/2009  Walitzki ................. H01J 45/00
                                                  257/104
7,833,886 B2 * 11/2010  Giles ................ H01L 21/26506
                                                  257/E21.4
(Continued)

FOREIGN PATENT DOCUMENTS

CN      101494223 A    7/2009
CN      101572233 A   11/2009
(Continued)

*Primary Examiner* — Tod T Van Roy
*Assistant Examiner* — Vu A Vu
(74) *Attorney, Agent, or Firm* — Murphy, Bilak & Homiller, PLLC

(57) ABSTRACT

A Magnetic Czochralski semiconductor wafer having opposing first and second sides arranged distant from one another in a first vertical direction is treated by implanting first particles into the semiconductor wafer via the second side to form crystal defects in the semiconductor wafer. The crystal defects have a maximum defect concentration at a first depth. The semiconductor wafer is heated in a first thermal process to form radiation induced donors. Implantation energy and dose are chosen such that the semiconductor wafer has, after the first thermal process, an n-doped semiconductor region arranged between the second side and first depth, and the n-doped semiconductor region has, in the first vertical direction, a local maximum of a net doping concentration between the first depth and second side and a local minimum of the net doping concentration between the first depth and first maximum.

19 Claims, 7 Drawing Sheets

(51) Int. Cl.
*H01L 21/265* (2006.01)
*H01L 21/324* (2006.01)
*H01L 29/36* (2006.01)
*H01L 29/66* (2006.01)
*H01L 29/861* (2006.01)
*H01L 29/872* (2006.01)
*H01L 29/739* (2006.01)
*H01L 29/16* (2006.01)
*H01L 29/22* (2006.01)

(52) U.S. Cl.
CPC ........ *H01L 29/36* (2013.01); *H01L 29/66136* (2013.01); *H01L 29/66143* (2013.01); *H01L 29/8611* (2013.01); *H01L 29/872* (2013.01); *H01L 29/1608* (2013.01); *H01L 29/2203* (2013.01); *H01L 29/7395* (2013.01)

(58) Field of Classification Search
CPC ....... H01L 2924/00; H01L 2224/73265; H01L 2924/13091; H01L 2924/0002; H01L 2924/12042; H01L 2224/32145; H01L 2221/68327
USPC .......................................... 438/530
See application file for complete search history.

(56) References Cited

U.S. PATENT DOCUMENTS

| | | | |
|---|---|---|---|
| 7,982,289 B2* | 7/2011 | Schulze | ................ H01L 21/263 |
| | | | 257/607 |
| 2008/0035934 A1* | 2/2008 | Sheppard | .............. H01L 21/045 |
| | | | 257/76 |
| 2009/0224284 A1 | 9/2009 | Nemoto | |
| 2011/0042791 A1 | 2/2011 | Schulze et al. | |

FOREIGN PATENT DOCUMENTS

| | | |
|---|---|---|
| JP | H05308076 A | 11/1993 |
| JP | H0738102 A | 2/1995 |
| JP | H0766197 A | 3/1995 |
| JP | H09121052 A | 5/1997 |
| JP | H09260639 A | 10/1997 |
| JP | H11145147 A | 5/1999 |
| JP | 2006344977 A | 12/2006 |
| JP | 2008211148 A | 9/2008 |
| JP | 2009099705 A | 5/2009 |
| JP | 2009524227 A | 6/2009 |
| JP | 2010222241 A | 10/2010 |
| JP | 2012238904 A | 12/2012 |
| JP | 5162964 B2 | 3/2013 |
| WO | 2012081664 A1 | 6/2012 |
| WO | 2013100155 A1 | 7/2013 |

* cited by examiner

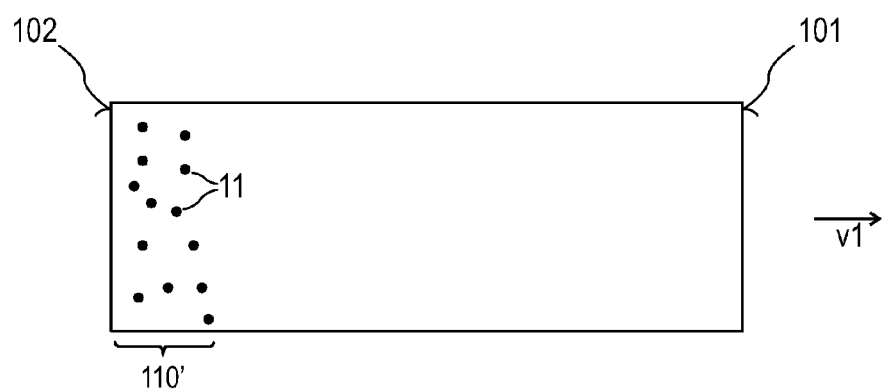
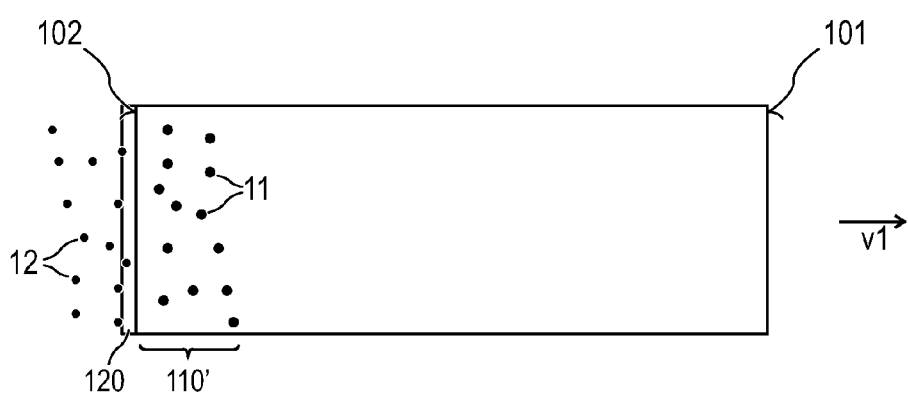
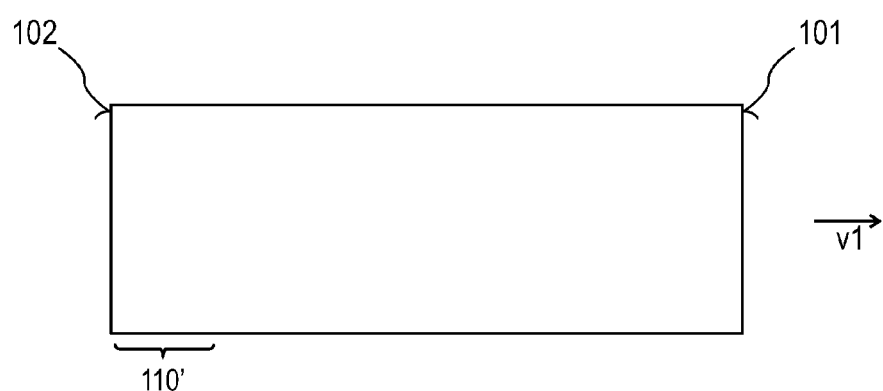

METHOD FOR TREATING A SEMICONDUCTOR WAFER

TECHNICAL FIELD

The present invention relates to a method for treating a semiconductor wafer.

BACKGROUND

Power semiconductor components usually have a drift zone that takes up a reverse voltage when a rectifying junction of the component, e.g. a pn-junction or a Schottky junction, is in a blocking state. The drift zone has a thickness that is adapted to the desired voltage blocking capability of the power semiconductor component. That is, the higher the voltage blocking capability of the power semiconductor component the higher the thickness of the drift zone and the lower the doping of the same. In terms of low switching oscillations, a variation of the vertical doping profile of the drift zone is beneficial. In detail, a profile exhibiting a local maximum in a depth below the rectifying junction, followed by a continuous decrease of the doping concentration towards a field-stop layer is most desired.

However, economically producing a thick drift zone having a pre-defined doping profile is challenging. Implanting or diffusing of electrically active dopants into a thick semiconductor material is hardly practicable in view of the required implantation or diffusion depths. Epitaxially growing a thick drift zone is, on the one hand, time-consuming, and, on the other hand, controlling the epitaxial process in order to achieve dopant concentrations required for power semiconductor components having high blocking voltages is difficult. In case of an n-doped drift zone, radiation-induced donors may be used. After irradiating the wafer with high-energy particles, e.g. protons, and a subsequent thermal process, donors are generated following the damage concentration profile of the implantation. For a single implantation, this profile exhibits a continuous increase towards the bragg-peak of the implantation. Hence, conventional implantation techniques require Bragg peaks at different implantation depths which means implanting high-energy particles with significantly different implantation energies. This is leads to an undesired process with multiple subsequent steps, significantly increasing the process time and likelihood of errors.

Hence, there is a need for an improved method that can be used for the production of a power semiconductor component having a high blocking voltage, in particular for the production of a power semiconductor component having a doping concentration with a local maximum in the drift zone.

SUMMARY

A first aspect relates to a method for treating a semiconductor wafer. In that method, a Magnetic Czochralski semiconductor wafer having a first side and a second side opposite the first side is provided. The first side is arranged distant from the second side in a first vertical direction. First particles are implanted into the semiconductor wafer via the second side to form crystal defects in the semiconductor wafer. The crystal defects have a maximum defect concentration at a first depth. The semiconductor wafer is heated in a first thermal process to form radiation induced donors. An implantation energy and an implantation dose for implanting the particles are chosen such that the semiconductor wafer has, after the first thermal process, an n-doped semiconductor region arranged between the second side and the first depth, and that the n-doped semiconductor region has, in the first vertical direction, a local maximum of a net doping concentration between the first depth and the second side and a local minimum of the net doping concentration between the first depth and the first maximum.

A second aspect relates to a method for treating a semiconductor wafer. In that method, a semiconductor wafer having a first side and a second side opposite the first side is provided. The first side is arranged distant from the second side in a first vertical direction. First particles are implanted into the semiconductor wafer via the second side to form crystal defects in the semiconductor wafer. The crystal defects have a maximum defect concentration at a first depth. The heating the semiconductor component wafer in a first thermal process to form radiation induced donors. Prior to or after the first thermal process, second particles which act inhibiting on the formation of radiation-induced donors are introduced into the semiconductor wafer. The first depth, the irradiation dose and a profile of the concentration of the inhibiting second particles are chosen such that the semiconductor wafer has, after the first thermal process, an n-doped semiconductor region arranged between the second side and the first depth, and that the n-doped semiconductor region has, in the first vertical direction, a local maximum of a net doping concentration between the first depth and the second side, and a local minimum of the net doping concentration between the first depth and the first maximum.

Those skilled in the art will recognize additional features and advantages upon reading the following detailed description, and upon viewing the accompanying drawings.

BRIEF DESCRIPTION OF THE FIGURES

Exemplary embodiments of the present invention are explained in more detail below with reference to figures.

FIG. 6 shows a semiconductor wafer with inhibiting second particles introduced into a target region adjacent the second side, which inhibiting second particles inhibit the formation of radiation-induced donors;

FIG. 7 shows a semiconductor wafer in which hydrogen atoms are diffused as inhibiting second particles into the target region;

FIG. 8 shows a semiconductor wafer in which hydrogen atoms are diffused as inhibiting second particles into the target region during the deposition of a nitride layer in a plasma deposition process;

FIG. 9 shows a semiconductor wafer in which hydrogen cations are implanted into the target region;

DETAILED DESCRIPTION

In the figures, unless indicated otherwise, identical reference symbols designate identical wafer regions or component regions with the same meaning.

Figure 1A:
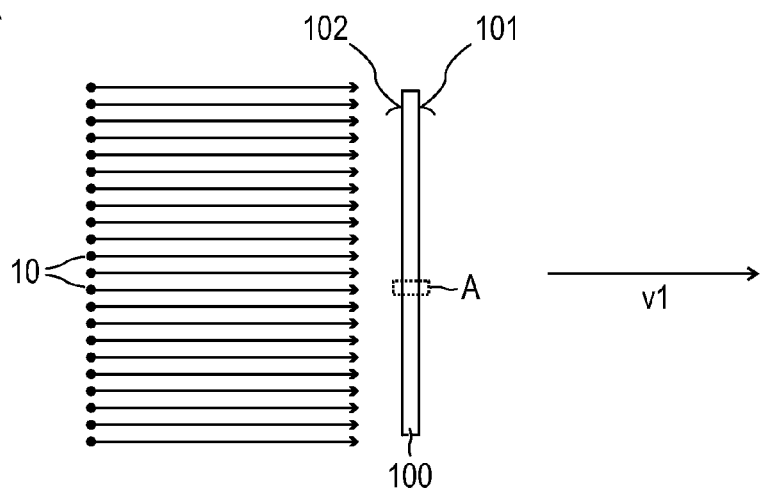
FIG. 1A shows a cross-sectional side view of a semiconductor wafer.

FIG. 1A schematically shows a cross-sectional side view of a semiconductor wafer 100. The semiconductor wafer 100 may be a FZ wafer, a CZ wafer, or a MCZ wafer.

In general, known methods for producing semiconductor single crystals, e.g. silicon single crystals, which are typically used for the realization of semiconductor components, are the so-called float zone method (FZ method) and the Czochralski method (CZ method). Disk-like semiconductor wafers which are cut off from the monocrystalline semiconductor ingots produced using one of those methods form the basis for the production of semiconductor components. Compared with the FZ method, the CZ is more cost-effectively but affords the disadvantage that the single crystal, owing to the production method, has a high oxygen concentration, which is typically in the range of several $10^{17}$ atoms/cm$^3$ to a few $10^{18}$ atoms/cm$^3$.

Thermal processes which occur during the methods for producing and processing the semiconductor wafers have the effect that the oxygen present in high concentration in the wafer forms so-called oxygen precipitates. These should be understood to mean oxygen agglomerates or oxygen-vacancy agglomerates in the semiconductor crystal. These precipitates act, inter alia, as gettering centers for heavy metal atoms which can pass into the wafer during the method for producing the components. If such precipitates are present in an active component zone of a semiconductor component, however, they lead to an impairment of the component properties by virtue of the fact that they act as recombination centers for free charge carriers and by virtue of the fact that they act as generation centers for charge carrier pairs, this last leading to an increase in the leakage current flowing during reverse operation of the component.

For the reasons mentioned above, conventional CZ wafers are of only limited suitability for the realization of power components having a dielectric strength of a few hundred volts. Without further treatment, conventional CZ wafers are suitable for said components only as a semiconductor substrate to which further (oxygen-poor) semiconductor layers are applied by means of complicated and hence cost-intensive epitaxy methods, in which semiconductor layers the regions of a power component which take up a reverse voltage, for example the drift zone of a MOSFET or the n-type base of an IGBT or a diode, are realized.

A "magnetic Czochralski wafer" as mentioned above is a certain kind of CZ wafer that has—compared with a conventional CZ-wafer—a very low oxygen concentration which can be achieved by applying an external magnetic field during the crystal growth of the ingot from which the (non-conventional) magnetic CZ wafer is cut. Such a (non-conventional) CZ wafer is also referred to as magnetic Czochralski wafer or, briefly, as "MCZ wafer". A consequence of the very low oxygen concentration is a—compared with a conventional CZ wafer—very low concentration of oxygen precipitates. In the sense of the present invention, a wafer is regarded as "MCZ wafer" if it has, all over the wafer, a maximum concentration of interstitial oxygen ("Oi-level") of less than $4 \times 10^{17}$ atoms/cm$^3$ atoms/cm$^3$. All values for interstitial oxygen cited in this document are specified for infrared spectroscopy based measurement according to the standard New ASTM (ASTM F 121, 1980-1983). For example, the semiconductor material of the semiconductor wafer 100 is silicon.

The semiconductor wafer 100 is a flat disk that has a first side 101 and a second side 102 opposite the first side 101 which may both be plane and run parallel to one another. The first side 101 is arranged distant from the second side 102 in a first vertical direction v1 which runs perpendicular to the first side 101. In this regard it is to be noted that the first vertical direction v1 does not only include an axis but also an orientation. That means that the second side 102 is not arranged distant from the first side 101 in the first vertical direction v1 but in the opposite direction.

In the first vertical direction v1, the semiconductor wafer 100 has a thickness t100 which is, for instance, at least 400 μm. However, thicknesses t100 below 400 μm may be used as well.

Figure 1B:
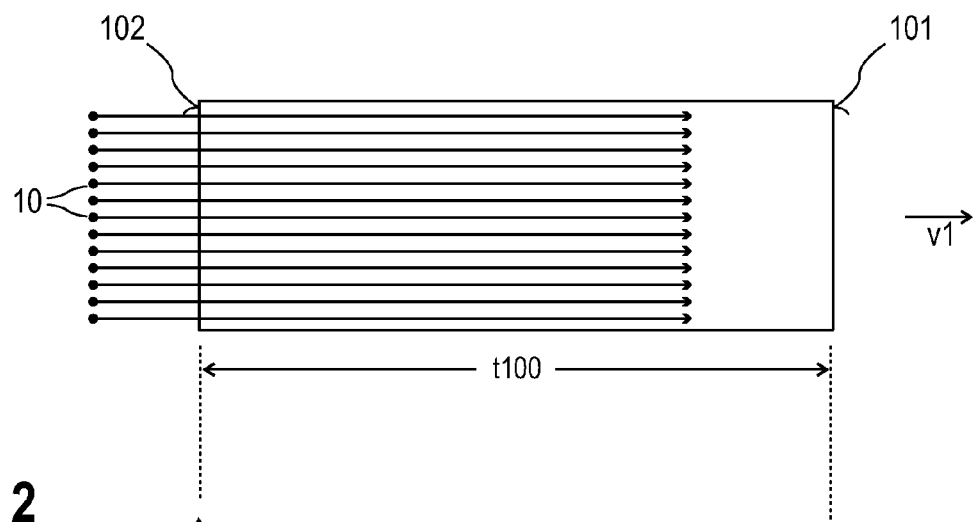
FIG. 1B shows an enlarged section A of the semiconductor wafer of FIG. 1A.

First particles 10 are implanted into the second side 102 so that the first particles 10 enter the semiconductor wafer 100 through the second side 102 and cause crystal defects in the semiconductor wafer 100. The implantation, which causes crystal defects like e.g. vacancies, double vacancies or vacancy/oxygen complexes in the semiconductor wafer 100, is carried out such that the crystal defects have a maximum defect concentration (i.e. the Bragg peak of the implantation) at a first depth d1 which is to be measured in the first vertical direction v1 relative to the second side 102. As the first depth d1 depends on the energy of the first particles 10, a desired first depth d1 (see FIG. 1B) may be achieved by appropriately adjusting the energy of the first particles 10. Suitable first particles 10 are, inter alia, protons.

Optionally, the first depth d1 may be at least 40 μm or at least 80 μm, and/or at least 5% or at least 10% of the thickness t100 the semiconductor wafer 100 has in the first vertical direction v1.

As also illustrated in FIG. 1A, the implantation may cover the whole second side 102. Alternatively, only a section of the semiconductor wafer 100 may be treated as described herein.

Figure 2:
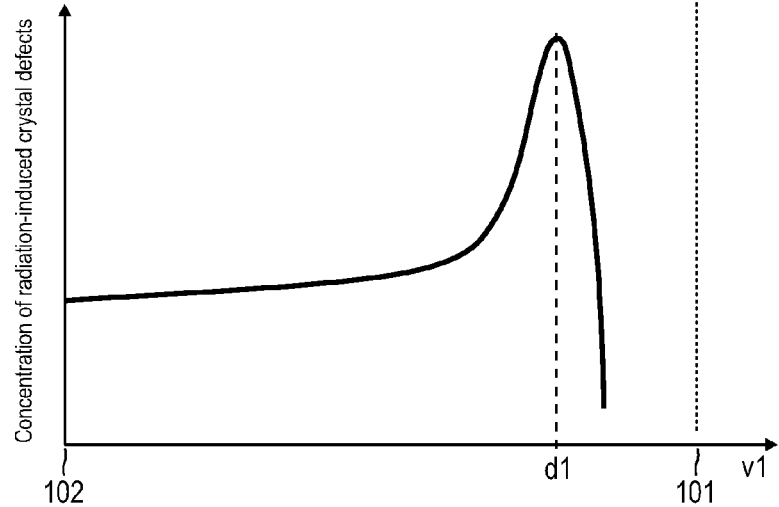
FIG. 2 is a diagram that shows the concentration of crystal damages of the wafer of FIG. 1B after the implantation is completed and prior to a subsequent first thermal process.

FIG. 2 shows the concentration of crystal damages of the wafer 100 after the implantation is completed and prior to a subsequent first thermal process.

After a first thermal process, in which the semiconductor wafer 100 is heated to temperatures of between 400° C. and 570° C., in particular of between 470° C. and 510° C., radiation induced donors are produced. For instance, the first thermal process may last at least 1 h or at least 3 h. Further, the first thermal process may last less than or equal to 10 h or less than or equal to 20 h. In the above sense, "radiation-induced donors", for instance proton induced donors, are donors that occur as a result of semiconductor crystal damages caused by particles implanted into the semiconductor wafer 100, and a subsequent thermal process resulting in hydrogen-induced complexes. That is, "radiation-induced donors" are non-substitutional donors.

Figure 3:
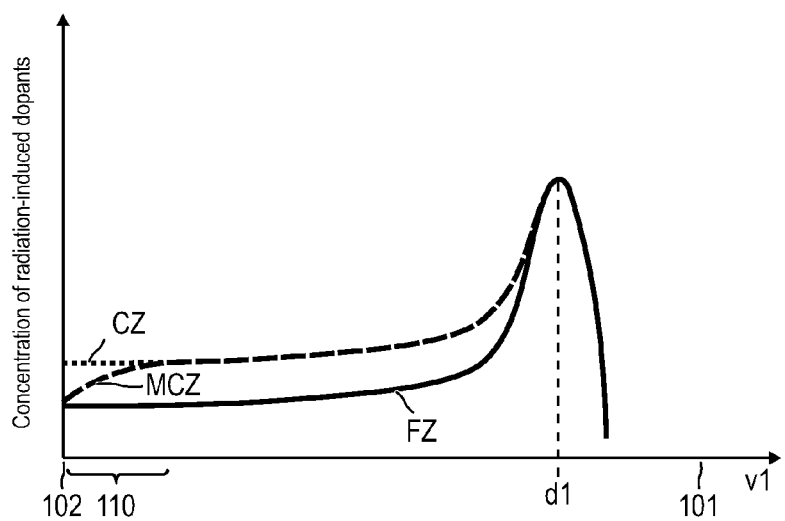
FIG. 3 is a diagram that shows the doping profiles of the wafer of FIG. 1B after the first thermal process is completed, for different wafer types.

The concentration profiles of the radiation induced donors are shown in FIG. 3 for different wafer types. The illustration is only qualitative in order to show a first effect that occurs if the semiconductor wafer 100 is an MCZ wafer. This first effect lies in the occurrence of a region 110 of lower oxygen concentration which adjoins the second side 102 and which results from a significant decrease of the Oi-level towards the wafer's 100 surface. The Oi-level affects the formation of radiation induced donors which are produced in a subsequent thermal process in that in semiconductor regions with a high Oi-level more radiation induced donors are produced than in semiconductor regions with a low Oi-level. In contrast to an MCZ wafer, there is substantially no significant corresponding region of lower oxygen concentration in case of an FZ or CZ wafer.

Figure 4:
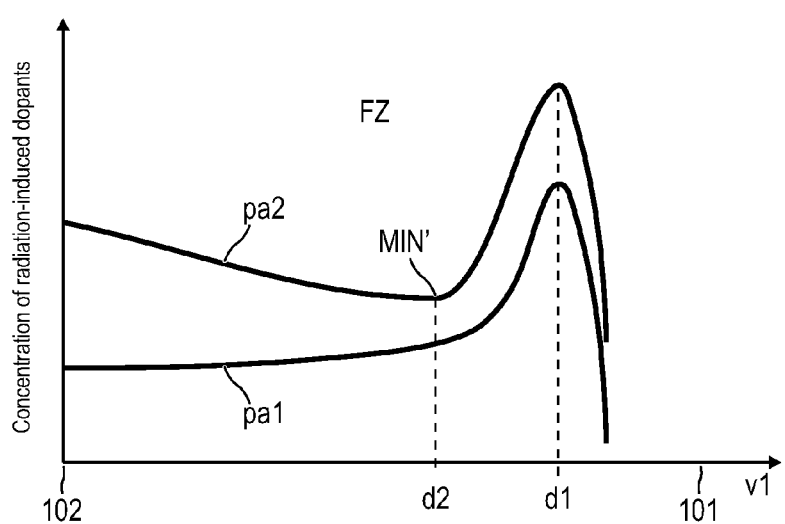
FIG. 4 is a diagram that shows doping profiles of an FZ or a conventional CZ wafer for different irradiation doses.

According to a second effect found by the inventors of the present invention illustrated in FIGS. 4 and 5, implanting first particles 10 having a sufficiently high implantation dose via an irradiated surface (here: the second side 102) of the semiconductor wafer 100 into the semiconductor wafer 100 and subsequently heating the semiconductor wafer 100 in a first thermal process causes a doping profile in which the donor concentration has a local minimum MIN'. The local minimum MIN' is arranged between the irradiated surface (here: the second side 102) and the first depth d1. FIG. 4 illustrates how the implantation dose affects the concentration profile of the radiation induced donors in an FZ. Concentration profile pa1 relates to a relatively low irradiation dose, e.g. less than $1·10^{14}$ particles/cm$^2$ of the implanted first particles 10, whereas concentration profile pa2 relates to a higher irradiation dose of the implanted first particles 10, e.g. at least $1·10^{14}$ particles/cm$^2$, or at least $4·10^{14}$ particles/cm$^2$. Comparing profiles pa1 and pa2, the second effect described above will become clear. That is, in case of a sufficiently high irradiation dose (profile pa2), the concentration of radiation induced donors has a local minimum MIN' that is arranged between the irradiated second surface 102 and the first depth d1. In contrast, there is no such minimum if the irradiation dose is too low (profile pa1).

Figure 5:
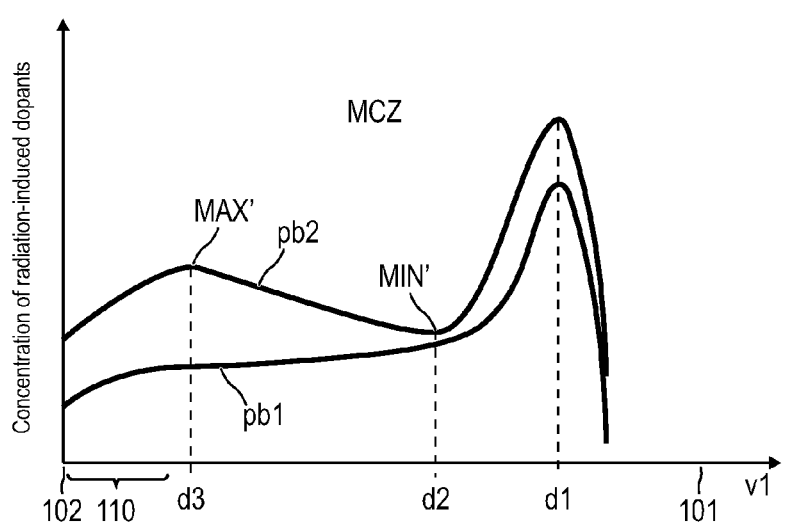
FIG. 5 is a diagram that shows doping profiles of an MCZ wafer for different irradiation doses.

The same effect occurs in case of an MCZ wafer which is illustrated in FIG. 5. Concentration profile pb1 relates to a comparatively low irradiation dose, e.g. less than $1·10^{14}$ particles/cm$^2$ of the implanted first particles 10, whereas concentration profile pb2 relates to a higher irradiation dose of the implanted first particles 10, e.g. at least $1·10^{14}$ particles/cm$^2$, or at least $4·10^{14}$ particles/cm$^2$. Just as profile pa2 of FIG. 4, also profile pb2 has a local minimum MIN' that is arranged between the irradiated second surface 102 and the first depth d1. However, as FIG. 5 relates to an MCZ wafer, also the "first effect" (a region 110 of lower oxygen concentration adjoining the second surface 102) occurs. As a result, the first and second effect superpose so that the concentration profile pb2 has a local maximum MAX' with the local minimum MIN' arranged between the local maximum MAX' and the first depth d1.

However, a concentration profile of the radiation induced donors having a local Maximum MAX' can also be achieved in case of an FZ or a conventional CZ wafer if a region 110 of lower oxygen concentration is artificially produced. To that end, second particles 11 which act inhibiting on the formation of radiation-induced donors may be introduced into the semiconductor wafer 100 prior to or after the first thermal process, see FIG. 6. Of course, such inhibiting second particles 11 may be used for the same purpose and in the same manner in order to exacerbate the formation of the maximum MAX'. In FIG. 6, the target region in which the inhibiting second particles 11 are introduced is designated with 110'. During the first thermal step, the target region 110' will substantially be converted into the region 110 of lower oxygen concentration described above.

In any case, the inhibiting second particles 11 may be introduced into the semiconductor wafer 100 prior to or after implanting the first particles through the second side 102 into the semiconductor wafer 100. At the beginning of the first thermal process or afterwards, that is, prior to or after producing the radiation-induced donors, there is a profile of the concentration of the inhibiting second particles 11. The first depth d1, the irradiation dose and the profile of the concentration of the inhibiting second particles 11 are selected such that the concentration profile of the radiation induced donors has, at the end of the first thermal process in which radiation-induced donors are produced, a local minimum MIN' located at a second depth d2 which is less than the first depth d1 and a local maximum MAX' located at a third depth d3 which is less than the second depth d2. This is illustrated in both FIGS. 4 and 5.

The inhibiting second particles 11 may consist of or include, e.g., hydrogen atoms or hydrogen cations. For instance, the hydrogen may be diffused into the semiconductor wafer 100 via the second side 102. Optionally, the diffusion may take place by treating the semiconductor wafer 100 in a hydrogen plasma, see FIG. 7.

A further method for introducing hydrogen into the semiconductor wafer 100 is a plasma deposition process in which a nitride layer 120 is produced on the second side 102 if in the deposition process at least one hydrogen containing precursor 12, e.g. SiH$_4$ and/or NH$_3$ is used, see FIG. 8.

As further illustrated in FIG. 9, it is also possible to implant hydrogen cations 11 like protons via the second side 102 into the semiconductor wafer 100 and to subsequently diffuse the implanted hydrogen during a second thermal process by heating the semiconductor wafer 100 to temperatures of, e.g., between 350° C. and 550° C. The second thermal process may last, for instance, at least 30 min and/or, for instance, less than or equal to 10 h.

Figure 10:
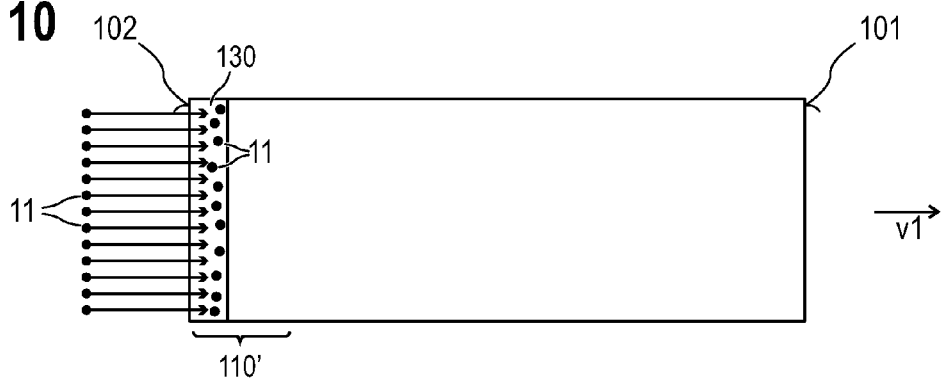
FIG. 10 shows a semiconductor wafer in which hydrogen cations are implanted into a p-doped layer adjacent the second side.

Still a further method for introducing hydrogen into the semiconductor wafer 100 is to implant hydrogen 11 cations into a p-doped semiconductor region 130 which is arranged between the second side 102 and the first depth d1 and to subsequently diffuse the implanted hydrogen 11 during a third thermal process by heating the semiconductor wafer 100 to temperatures of, e.g., between 350° C. and 550° C., see FIG. 10. The third thermal process may last, for instance, at least 30 min, and/or, for instance, less than or equal to 10 h. After the third thermal process, in the originally p-doped semiconductor region 130 the acceptor concentration $N_A$ is significantly higher than the donor concentration $N_D$ so that the originally p-doped semiconductor region 130 remains p-doped.

Figure 11:
FIG. 11 is a diagram that shows the concentration of inhibiting second particles that have been diffused into a semiconductor.

FIG. 11 schematically illustrates the concentration profile pc1 (dashed line) after the inhibiting second particles 11 have been diffused into the semiconductor wafer 100 and prior to the second thermal process, and profile pc2 (solid line) after the second thermal process. FIG. 11 relates to the diffusion processes described with reference to FIGS. 7 and 8.

Figure 12:
FIG. 12 is a diagram that shows the concentration of inhibiting second particles that have been implanted into a semiconductor.

Accordingly, FIG. 12 schematically illustrates the concentration profile pd1 (dashed line) after the inhibiting second particles 11 have been implanted into the semiconductor wafer 100 and prior to the second thermal process, and profile pd2 (solid line) after the third thermal process. FIG. 12 relates to the diffusion processes described with reference to FIGS. 9 and 10.

The described methods for introducing inhibiting second particles 11 into the semiconductor wafer 100 may be combined with each other and also with further methods in an arbitrary manner.

Figure 13:
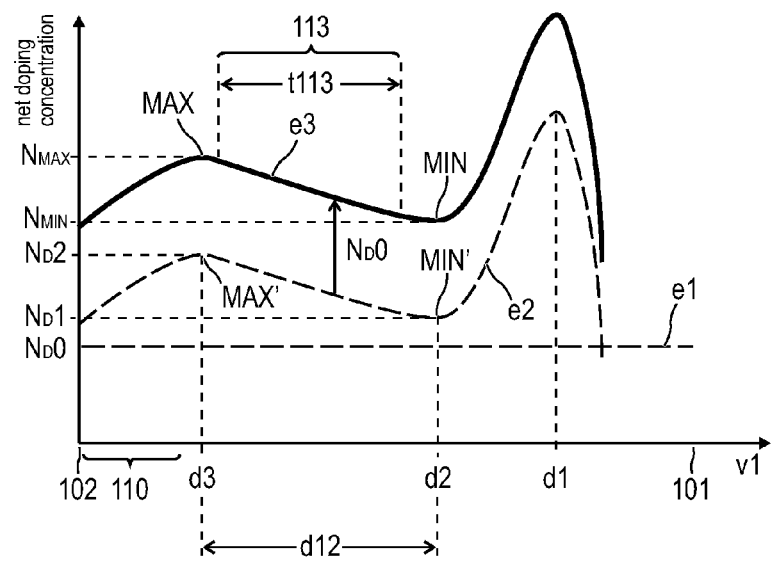
FIG. 13 is a diagram that shows the total donor concentration of a semiconductor wafer in which first particles and inhibiting second particles have been implanted.

The examples described above relate to methods for producing certain donor profiles caused only by irradiation induced donors. Optionally, such a donor profile may be superposed with other profiles. For instance, as illustrated in FIG. 13, the provided semiconductor wafer 100 used at the beginning of the described methods, in particular prior to implanting the first particles 10, may have a constant basic doping of n-conduction type (constant net doping concentration $N_D0$, see doping profile e1) in order to adjust a desired resistance of a drift zone to be produced from the semiconductor wafer 100. Such a constant basic doping, which in particular may be of an n-conduction type, causes an offset $N_D0$ of the doping profile e2 caused by the radiation induced donors resulting from the implanted first particles 10 and the inhibiting particles 11. Such a basic doping may be achieved during the production of the ingot, from which the wafer is cut, by adding electrically active substitutional dopants to the melt. The resulting donor concentration profile e3 is a superposition of the doping profiles e1 and e2.

Figure 14:
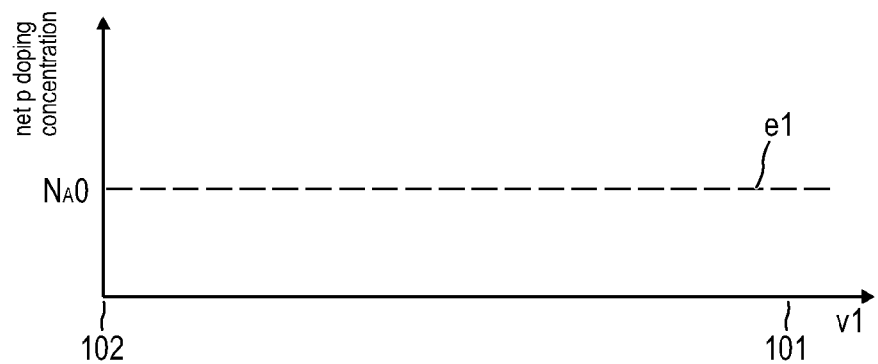
FIG. 14 is a diagram that shows the net doping concentration of a provided semiconductor wafer having a constant p-doping.
Figure 15:
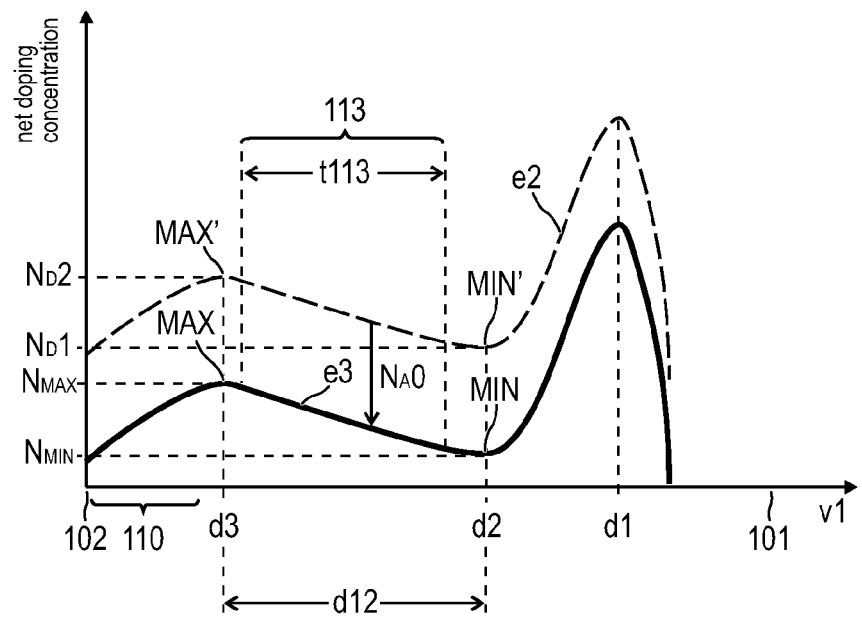
FIG. 15 is a diagram that shows the total donor concentration of the p-doped semiconductor wafer of FIG. 14 in which first particles and inhibiting second particles have been implanted.

In the same manner, the provided semiconductor wafer 100 may have a constant basic doping of p-conduction type (constant net doping concentration $N_A0$, see profile e1 in FIG. 14). Again, the resulting donor concentration profile e3 is a superposition of the doping profiles e1 and e2, see FIG. 15. Optionally, the net doping concentration $N_A0$ may be adjusted such that the resulting donor concentration e3 is, at each depth in the first vertical direction v1, greater than zero.

A further method to achieve a constant basic doping of the provided semiconductor wafer is to appropriately adjust the (substantially constant) concentration of interstitial oxygen ("Oi-level") of the ingot, from which the semiconductor wafer 100 is cut, during the production of the ingot as the achieved offset of the donor concentration is the higher the higher the Oi-level is.

If the semiconductor material of the semiconductor wafer 100 includes silicon, a further method is to irradiate the semiconductor wafer 100 with neutrons in order to produce n-doping phosphorus by "neutron transmutation doping" in which the Si-30 isotope is converted into phosphorus by neutron absorption.

Figure 16:
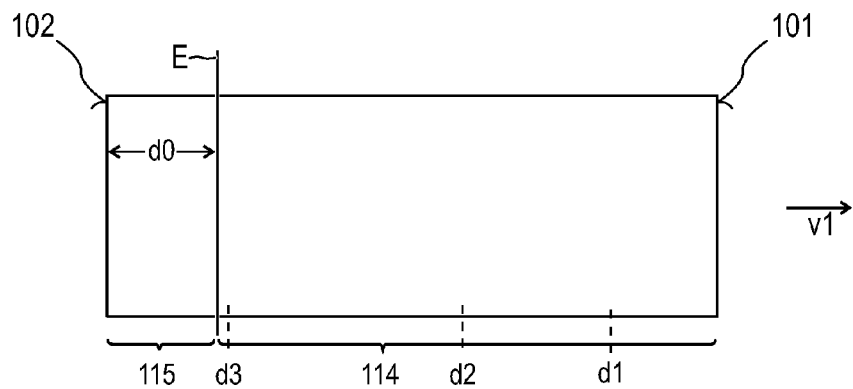
FIG. 16 shows a semiconductor wafer having a denuded region.
Figure 17:
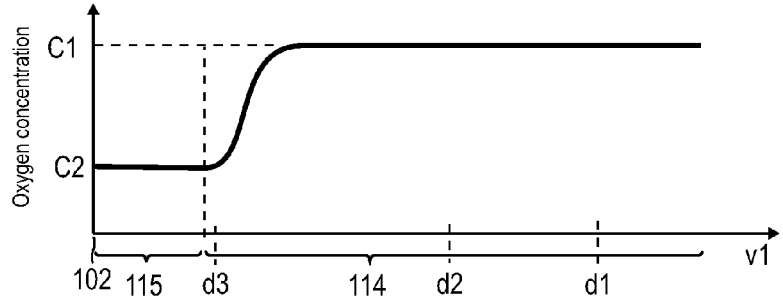
FIG. 17 is a diagram that shows the oxygen concentration of the semiconductor wafer of FIG. 16.

Referring now to FIGS. 16 and 17, a semiconductor wafer 100 used in connection with the present invention may optionally have a denuded layer 115 (also known as "denuded zone") and a non-denuded layer 114. Compared with the non-denuded layer 114, the denuded layer 115 has a lower oxygen concentration. FIG. 16 shows a section of the semiconductor wafer 100 and FIG. 17 the concentration of interstitial oxygen in the vertical direction v1. The non-denuded layer 114 ranges from the first side 101 to a first plane E that runs parallel to the first side 101 and has a first maximum concentration C1 of interstitial oxygen. The denuded layer 115 ranges from the second side 102 to the first plane E and has a second maximum concentration C2 of interstitial oxygen which is lower than the first maximum interstitial oxygen concentration C1. Optionally, the first maximum concentration C1 may be at least 2-times the second interstitial oxygen concentration C2.

For instance, such a denuded layer 115 may be produced with one of the methods for producing a denuded zone described in US Patent Publication No. 2011/042791 A1.

In order to ensure that the maximum MAX is arranged in the denuded region 115, the distance d0 between the second side 102 and the first plane E may be greater than the third depth d3. Optionally, the distance d0 may also be greater than the second depth d2 or than the first depth d1.

The semiconductor wafer 100 or a section of the semiconductor wafer 100 having a doping profile produced with each of the methods described above and having both a local minimum MIN and a local maximum MAX may be used for the production of a power semiconductor component with a drift zone. In particular, the drift zone of the completed semiconductor component may include a continuous section of the semiconductor wafer 100 that includes both the maximum MAX and the minimum MIN of the doping profile achieved with one of the described methods.

Optional properties of such a doping profile will exemplarily be explained based on the doping profile e3 already described with reference to FIG. 13. According to a first option, the first depth d1 may be at least 80 µm. According to a second option, a difference d23 between the second depth d2 and the third depth d3 may be at least 25 µm. According to a third option, the second depth d2 may be at least 50 µm. According to a fourth option, the third depth d3 may be at least 10 µm. According to a fifth option, the doping concentration ND1 at the local minimum MIN may be between $5 \cdot 10^{12}$ cm$^{-3}$ and $2 \cdot 10^{13}$ cm$^{-3}$. According to a sixth option, the doping concentration ND2 at the local maximum MAX may be between $3 \cdot 10^{13}$ cm$^{-3}$ and $2 \cdot 10^{14}$ cm$^{-3}$, preferably between $4 \cdot 10^{13}$ cm$^{-3}$ and $1 \cdot 10^{14}$ cm$^{-3}$. Then, according to a seventh option, the donor concentration profile may have a first net doping concentration $C_{MAX}$ at the second depth d2 and a second net doping concentration $C_{MIN}$ at the third depth d3 The ratio $C_{MAX} \div C_{MIN}$ may be, for instance, at least 1.5 or at least 2.0. The ratio $C_{MAX} \div C_{MIN}$ may be, for instance, at least 1.5 or at least 2.0. Alternatively or in addition, the ratio $C_{MAX} \div C_{MIN}$ may be, for instance, less than or equal to 20.0, or less than or equal to 6.0.

Figure 18:
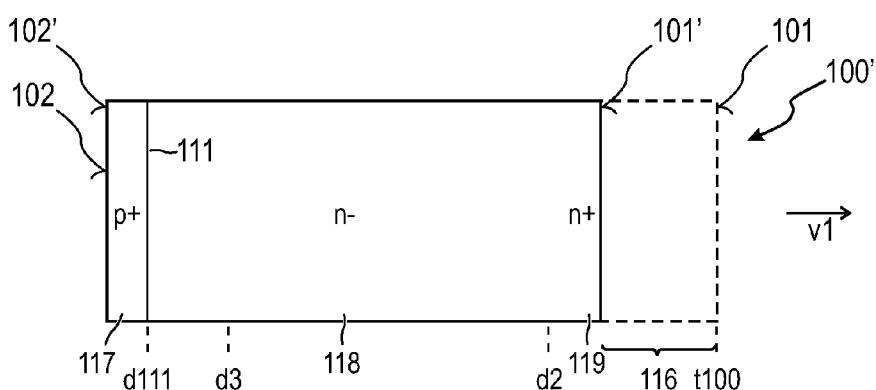
FIG. 18 shows a semiconductor component produced from a semiconductor wafer that has been treated according to one of the described methods.
Figure 19:
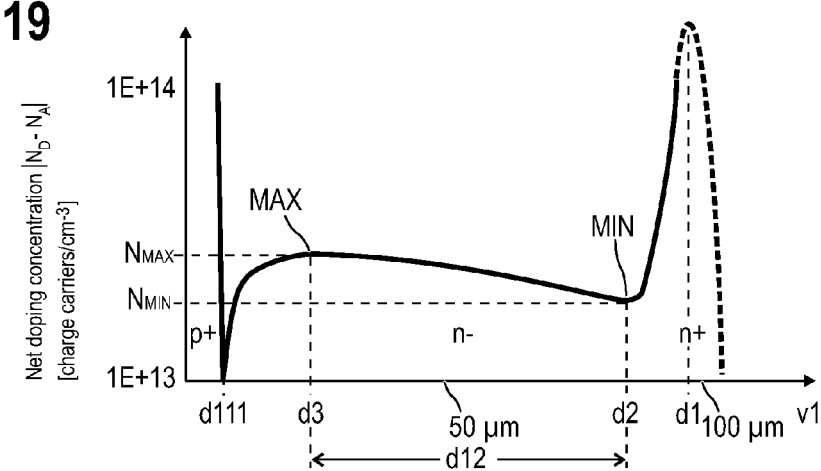
FIG. 19 is a diagram that shows the doping concentration of the semiconductor component of FIG. 18.

FIG. 18 shows a vertical power semiconductor component 100' produced from a MCZ semiconductor wafer 100 that has been treated according to one of the methods explained above. FIG. 19 illustrates the absolute value $|N_D - N_A|$ of the net doping profile of the power semiconductor component 100'. $N_D$ is the total donor concentration and $N_A$ the total acceptor concentration. The semiconductor component 100' has been produced by implanting protons as first particles 10 having an energy of about 3 MeV through the second side 102 into a semiconductor wafer 100. The implantation dose was $1.7 \cdot 10^{14}$ protons/cm$^2$. Subsequent to the implantation, the semiconductor wafer 100 was annealed for 5 hours at a temperature of 490° C.

The semiconductor component 100' comprises only a section of the semiconductor wafer 100. At the first side 101, a surface section 116 has been removed, for instance by grinding and/or polishing. Removing the surface section 116 may take place prior to the first thermal process, between the first thermal process and the second thermal process, between the second thermal process and the third thermal process, or after the third thermal process (as far as those processes are employed).

Different from the present embodiment, also a further section at the second side 102 may be removed. As a result, a final first side 101' and, optionally, a final second side 102' of the semiconductor remain. If there is no further section at the second side 102 removed, the final second side 102' is identical to the original second side 102.

At a depth d111, the semiconductor component 100' has a rectifying junction 111, here a pn-junction formed between a heavily p-doped (p+) semiconductor region 117 and a weakly n-doped (n−) drift region 118. Alternatively, the rectifying junction 111 may be a Schottky junction if d111=0 and a Schottky metal electrode would be deposited on the final second side 102', and the drift region 118 would adjoin the Schottky metal electrode. The semiconductor component 100' further has a heavily n-doped (n+) field stop region 119 adjoining the drift region 118. As can be seen from FIG. 19, the field stop region 119 may be a remainder of a doping peak that harks back to the radiation induced donors caused by the maximum concentration of the crystal defects at the first depth d1. However, it would also be possible to completely remove that peak so that the position of the local minimum would be the final first side 101'.

A method for further reducing the net doping concentration $N_{MIN}$ at the second depth d2 will now be illustrated with reference to FIGS. 20 to 22 based on the example illustrated in FIGS. 18 and 19. In addition or alternatively to the use of inhibiting second particles 11, inhibiting third particles 13 may be introduced into the semiconductor wafer 100 or a remainder therefrom through the first side 101, the final first side 101', or any intermediate side. The inhibiting particles 13 act inhibiting on the formation of radiation-induced donors in the same manner as the inhibiting particles 11 described above. The inhibiting third particles 13 may be one of the kind of particles mentioned with respect to the inhibiting second particles 11, or they may be produced from the same kind of precursors as the precursors 12 described above. Further, the inhibiting third particles 13 or precursors thereof may be introduced in one of the manners described for the second particles 11 and the precursors 12, respectively.

In any case, introducing the inhibiting third particles 13 may take place prior to or after the first thermal process. In FIG. 21, the target region in which the inhibiting third particles 13 are introduced is designated with 110''. During the first thermal step, the inhibiting third particles 13 in the target region 110'' act diminishing on the formation of radiation-induced donors based on the principle described for the inhibiting second particles 11.

Figure 20:
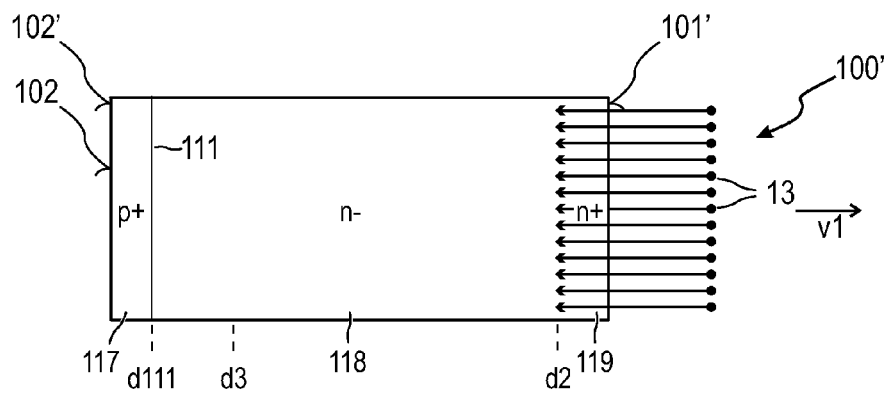
FIGS. 20 through 22 illustrate a method for further reducing the net doping concentration based on the example illustrated in FIGS. 18 and 19.
Figure 21:
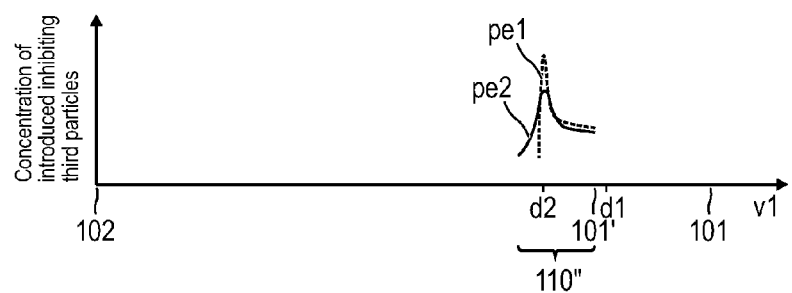
Figure 22:
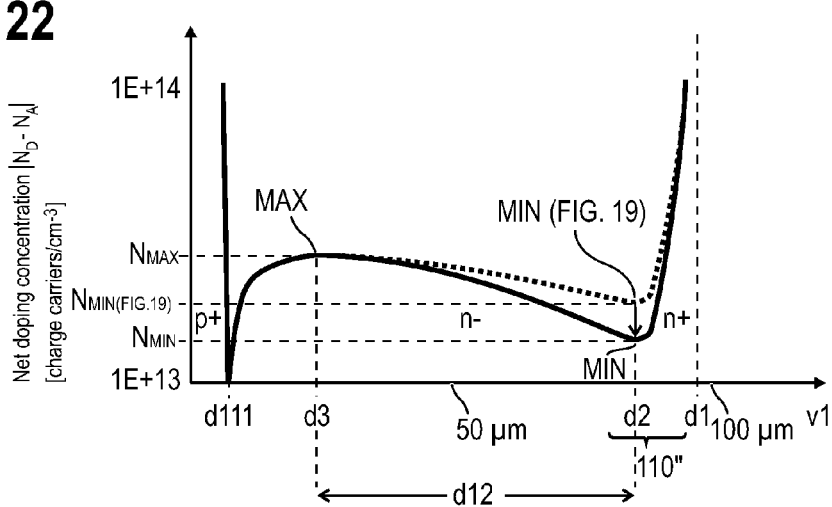

FIG. 21 schematically illustrates the concentration profile pe1 (dashed line) after the inhibiting third particles 13 have been produced by implanting the third particles 13 into the semiconductor wafer 100 and prior to the second thermal process, and profile pe2 (solid line) after the second thermal process. Implanting the third particles 13 allows a maximum concentration of the third particles 13 that is arranged distant from the surface of the semiconductor wafer 100. This may be desired in case of a heavily n-doped field stop zone (n+ in FIGS. 20 and 22) arranged at a depth greater than the second depth d2. In this case, diffusing the third particles 13 into the semiconductor wafer 100 would result in a concentration of the third particles 13 decreasing with the diffusion depth. That is, the diminishing effect of the third particles 13 would substantially occur in the region of the desired field stop zone but not in the region of the desired minimum MIN at the second depth d2. However, a field stop zone may also include the second depth d2 so that the maximum concentration of the third particles 13 is "hidden" within the field stop zone. It is also possible, that a field stop zone is caused substantially from the third particles, that is, the field stop zone substantially is defined by the net doping concentration resulting from the maximum concentration of the third particles 13.

If the maximum concentration of the implanted third particles 13 is located approximately at the second depth d2, the net doping concentration $N_{MIN}$ at the minimum MIN (see FIG. 22) is reduced compared with the net doping concentration $N_{MIN}$ at the minimum MIN of FIG. 19. In order to facilitate the comparison, FIG. 22 also illustrates the net doping concentration of FIG. 19 (dotted curve).

Albeit the semiconductor component 100' presented in FIGS. 18 and 20 is a diode, the methods for treating a semiconductor wafer 100 described herein may also be used for the production of other power semiconductor components, for instance, IGBTs, MOSFETs, thyristors, etc.

Optionally, a semiconductor component 100' may have two or more field stop regions arranged distant from one another between the drift region 118 and the final first side 101'. One of those field stop regions may be the above-described remainder, and the further ones may be produced by implanting and substitutional electrically active dopants into the semiconductor through the original first side 101, through the final first side 101', or through any intermediate first side that exists when the semiconductor material is removed at the original first side 101, and by subsequently annealing the semiconductor wafer 100. The net doping concentration profile of such a field stop region achieved as a result of an implantation and a subsequent thermal annealing process may have a full width at half maximum of about 10% of the distance between the location of the field stop zone's maximum doping concentration and that side of the semiconductor wafer the implanted dopants have entered the semiconductor wafer 100.

Albeit the present invention has been described for silicon as semiconductor material of the treated semiconductor wafer 100, any other known semiconductor material, e.g. silicon carbide or gallium arsenide or gallium nitride, may be used as well.

Further, it is to be noted that the doping profiles explained above, insofar those relate to the donor concentration $N_D$, may also represent, at least in a later drift region 118 of a semiconductor component 100' produced from the treated wafer, the net doping concentration $N_D$–$N_A$. In this case, in the region of the semiconductor wafer 100 which region later forms the drift region, the acceptor concentration $N_A$ is substantially zero.

The present invention relates, inter alia, to methods for treating semiconductor wafers. Whereas the first aspect relates to a method for treating in particular magnetic Czochralski semiconductor wafers, the second aspect relates to a method for treating any kind of wafers. The step of introducing second particles 11, which act inhibiting on the formation of radiation-induced donors, into the semiconductor wafer 100 is optional in the method according to the first aspect and mandatory in the method according to the second aspect. As far as a method makes use of that step, the following features and/or method steps (S1), (S2), (S3), (S4)

are applicable solely or in any combination with each other in the methods according to both the first and second step:

(S1) Second particles 11 may be introduced prior to irradiating the semiconductor wafer with the first particles 10.

(S2) Second particles 11 may be introduced into the semiconductor wafer 100 after irradiating the semiconductor wafer with the first particles 10.

(S3) Second particles 11 may consist of or comprise hydrogen. In that case the, the following features and/or method steps (S3-1), (S3-2) are applicable solely or in any combination with each other:

(S3-1) The hydrogen may be diffused or implanted into the semiconductor wafer 100 via the second side 102, or be introduced into the semiconductor wafer 100 during a plasma deposition process in which a nitride layer 120 is deposited on the second side 102.

(S3-2) The hydrogen may be implanted into a p-doped semiconductor region 130 of the semiconductor wafer 100 which p-doped semiconductor region is arranged between the second side 102 and the first depth d1 and subsequently be diffused in a third thermal process.

(S4) Third particles 13 which act inhibiting on the formation of radiation-induced donors may introduced into the semiconductor wafer 100. In that case the, the following features and/or method steps (S4-1), (S4-2), (S4-3), (S4-4) are applicable solely or in any combination with each other:

(S4-1) The third particles 13 may consist of or comprise hydrogen.

(S4-2) The third particles 13 may be introduced into the semiconductor wafer 100 via a side of the semiconductor wafer 100 opposite the second side 102.

(S4-3) The third particles 13 may be introduced into the semiconductor wafer 100 prior to the first thermal process.

(S4-4) The introduced third particles 13 may have a maximum concentration located at the second depth d2.

Further, in the methods according to both the first and second aspect, the following features and/or method steps (e), (f), (g), (h), (i), (j), (k), (l) are applicable solely or in any combination with each other:

(S5) The provided semiconductor wafer 100 may comprise both a non-denuded layer 114 ranging from the first side 101 to a first plane E parallel to the first side 101 and having a first maximum concentration C1 of interstitial oxygen, and a denuded layer 115 ranging from the second side 102 to the first plane E and having a second maximum concentration C2 of interstitial oxygen, wherein the first maximum concentration C1 is at least 2-times the second maximum concentration C2. In that case, the following features and/or method steps (S5-1), (S5-2) are applicable solely or in any combination with each other:

(S5-1) A distance d0 between the first plane E and the second side 102 may be greater than both the second depth d2 and the third depth d3.

(S5-2) A distance d0 between the first plane E and the second side 102 may be greater than the first depth d1.

(S6) The first particles 10 may be protons.

(S7) The first depth d1 may be at least 40 µm or at least 80 µm; and/or at least 5% or at least 10% of a thickness t100 the semiconductor wafer 100 has in the first vertical direction v1.

(S8) The semiconductor wafer 100 may have a thickness t100 of at least 400 µm.

(S9) The irradiation dose of the second particles 11 may be at least $1 \cdot 10^{14}$ cm$^{-2}$ or at least $4 \cdot 10^{14}$ cm$^{-2}$.

(S10) A difference d23 between the second depth d2 and the third depth d3 may be at least 25 µm.

(S11) The net doping concentration $|N_D-N_A|$ may have a first net doping concentration $C_{MAX}$ at the second depth d2 and a second net doping concentration $C_{MIN}$ at the third depth d3, wherein a ratio $C_{MAX} \div C_{MIN}$ between the first net doping concentration $C_{MAX}$ and the second net doping concentration $C_{MIN}$ may be at least one of:

at least 1.5 or at least 2.0; and/or less than or equal to 20.0 or less than or equal to 6.0.

(S12) The provided semiconductor wafer 100 may have, prior to implanting the first particles 10, a constant p-doping or a constant n-doping.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for treating a semiconductor wafer, the method comprising:

providing a semiconductor wafer having a first side and a second side opposite the first side, the first side being arranged distant from the second side in a first vertical direction;

implanting first particles via the second side into the semiconductor wafer to form crystal defects in the semiconductor wafer, the crystal defects having a maximum defect concentration at a first depth;

heating the semiconductor wafer in a first thermal process to form radiation-induced non-substitutional donors; and prior to the first thermal process, introducing second particles via the second side into the semiconductor wafer which act inhibiting on the formation of radiation-induced donors, wherein an irradiation dose and a profile of the concentration of the second particles are chosen such that the semiconductor wafer has, after producing the radiation-induced non-substitutional donors, an n-doped semiconductor region arranged between the second side and the first depth, and that the n-doped semiconductor region, in the first vertical direction, has a local maximum of a net doping concentration at a third depth between the first depth and the second side and a local minimum of the net doping concentration at a second depth between the first depth and the third depth.

2. The method as claimed in claim 1, wherein the semiconductor wafer is selected from the group consisting of:
 a Czochralski wafer;
 a magnetic Czochralski wafer; and
 a float zone wafer.

3. The method as claimed in claim 1, wherein the second particles are introduced prior to irradiating the semiconductor wafer with the first particles.

4. The method as claimed in claim 1, wherein the second particles are introduced after irradiating the semiconductor wafer with the first particles.

5. The method as claimed in claim 1, wherein the second particles comprise hydrogen.

6. The method as claimed in claim 5, wherein the hydrogen is diffused or implanted into the semiconductor wafer via the second side.

7. The method as claimed in claim 5, wherein the hydrogen is introduced into the semiconductor wafer during a plasma deposition process in which a nitride layer is deposited on the second side.

8. The method as claimed in claim 5, further comprising:
 implanting the hydrogen into a p-doped semiconductor region of the semiconductor wafer, the p-doped semiconductor region being arranged between the second side and the first depth; and
 diffusing the implanted hydrogen in a third thermal process.

9. The method as claimed in claim 1, further comprising:
 introducing third particles which act inhibiting on the formation of radiation-induced donors into the semiconductor wafer.

10. The method as claimed in claim 9, wherein the third particles comprise hydrogen.

11. The method as claimed in claim 9, wherein the third particles are introduced into the semiconductor wafer via the first side of the semiconductor wafer.

12. The method as claimed in claim 9, wherein the third particles are introduced into the semiconductor wafer prior to the first thermal process.

13. The method as claimed in claim 9, wherein the introduced third particles have a maximum concentration located at the second depth so as to reduce the local minimum of the net doping concentration at the second depth.

14. The method as claimed in claim 1, wherein the semiconductor wafer comprises:
 a non-denuded layer ranging from the first side to a first plane parallel to the first side and having a first maximum concentration of interstitial oxygen; and
 a denuded layer ranging from the second side to the first plane and having a second maximum concentration of interstitial oxygen,
 wherein the first maximum concentration is at least 2-times the second maximum concentration.

15. The method as claimed in claim 14, wherein a distance between the first plane and the second side is greater than both the second depth and the third depth.

16. The method as claimed in claim 14, wherein a distance between the first plane and the second side is greater than the first depth.

17. The method as claimed in claim 1, wherein the first particles are protons.

18. The method as claimed in claim 1, wherein a difference between the second depth and the third depth is at least 25 µm.

19. The method as claimed in claim 1, wherein the semiconductor wafer has, prior to implanting the first particles, a constant p-doping or a constant n-doping.

* * * * *